US012613262B2

(12) United States Patent　　　(10) Patent No.:　　US 12,613,262 B2
Akiyama　　　　　　　　　　　　　　(45) Date of Patent:　　　Apr. 28, 2026

(54) SIGNAL ANALYSIS APPARATUS, CONTROL CIRCUIT, STORAGE MEDIUM, AND SIGNAL ANALYSIS METHOD

(71) Applicant: Mitsubishi Electric Corporation, Tokyo (JP)

(72) Inventor: Yuji Akiyama, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 202 days.

(21) Appl. No.: 18/664,693

(22) Filed: May 15, 2024

(65) Prior Publication Data

US 2024/0295593 A1　　Sep. 5, 2024

Related U.S. Application Data

(63) Continuation of application No. PCT/JP2021/045613, filed on Dec. 10, 2021.

(51) Int. Cl.
G01R 23/16　　　(2006.01)
H04B 1/18　　　　(2006.01)

(52) U.S. Cl.
CPC ..................................... G01R 23/16 (2013.01)

(58) Field of Classification Search
CPC .. G01R 23/16; H03M 1/1215; H03M 1/1245; H04B 1/18
See application file for complete search history.

(56) References Cited

U.S. PATENT DOCUMENTS 9,075,446 B2　　7/2015　Garudadri et al.
9,313,072 B2 *　4/2016　Katabi ..................... H04B 1/16
(Continued)

FOREIGN PATENT DOCUMENTS

JP　　　　6038981 B2　12/2016
WO　WO 2014/191712 A1　12/2014
WO　WO 2016/186938 A1　11/2016
WO　WO 2021/117168 A1　6/2021
WO　WO 2021/245753 A1　12/2021

OTHER PUBLICATIONS

Extended European Search Report for European Application No. 20939240.6, dated May 6, 2024.

(Continued)

*Primary Examiner* — Neel D Shah
(74) *Attorney, Agent, or Firm* — Birch, Stewart, Kolasch & Birch, LLP

(57)　　　　　　　　ABSTRACT

A signal analysis apparatus includes: a reception unit outputting sampling sequences obtained by adding different delay times and sampling each signal at a sampling rate lower than a Nyquist rate; a time-frequency conversion unit converting each sampling sequence to a frequency domain signal; a signal processing unit collectively performing phase compensation processing and processing for canceling phase rotation between the sampling sequences; a frequency estimation unit estimating frequency of the target signal by determining a sub-Nyquist zone in which the target signal has been folded; a frequency selection unit selecting a frequency group with a higher estimated spectrum amplitude value based on a sum of values for each sub-Nyquist zone, the values being obtained by multiplication of the sampling sequences by the corresponding coefficients; and a separation unit performing separation processing for separation of an error in the target signal by using the frequency group selected.

15 Claims, 9 Drawing Sheets

(56) References Cited

U.S. PATENT DOCUMENTS

| | | | |
|---|---|---|---|
| 9,658,825 | B2 | 5/2017 | Garudadri et al. |
| 2022/0224365 | A1 | 7/2022 | Akiyama |
| 2023/0062385 | A1 | 3/2023 | Akiyama |

OTHER PUBLICATIONS

Romero et al., "Analog-to-information conversion by encoded multi-cosests," International Journal of Electronics Letters, vol. 8, No. 3, Apr. 22, 2019, pp. 319-328.
International Search Report (PCT/ISA/210) issued in PCT/JP2020/042964, dated Feb. 16, 2021, with an English translation.
Written Opinion of the International Searching Authority (PCT/ISA/237) issued in PCT/JP2020/042964, dated Feb. 16, 2021.
European Communication pursuant to Article 94(3) EPC for European Application No. 21 967 272.2, dated Oct. 21, 2025.
Extended European Search Report for European Application No. 21967272.2, dated Jan. 3, 2025.
U.S. Office Action for U.S. Appl. No. 17/984,368, dated Dec. 3, 2024.
International Search Report, issued in PCT/JP2021/045613, PCT/ISA/210, dated Jan. 25, 2022.
Yaghoobi et al., "An Efficient Implementation of the Low-Complexity Multi-Coset Sub-Nyquist Wideband Radar Electronic Surveillance", Sensor Signal Processing for Defence (SSPD), Sep. 2014, total 6 pages.

* cited by examiner

FIG.2

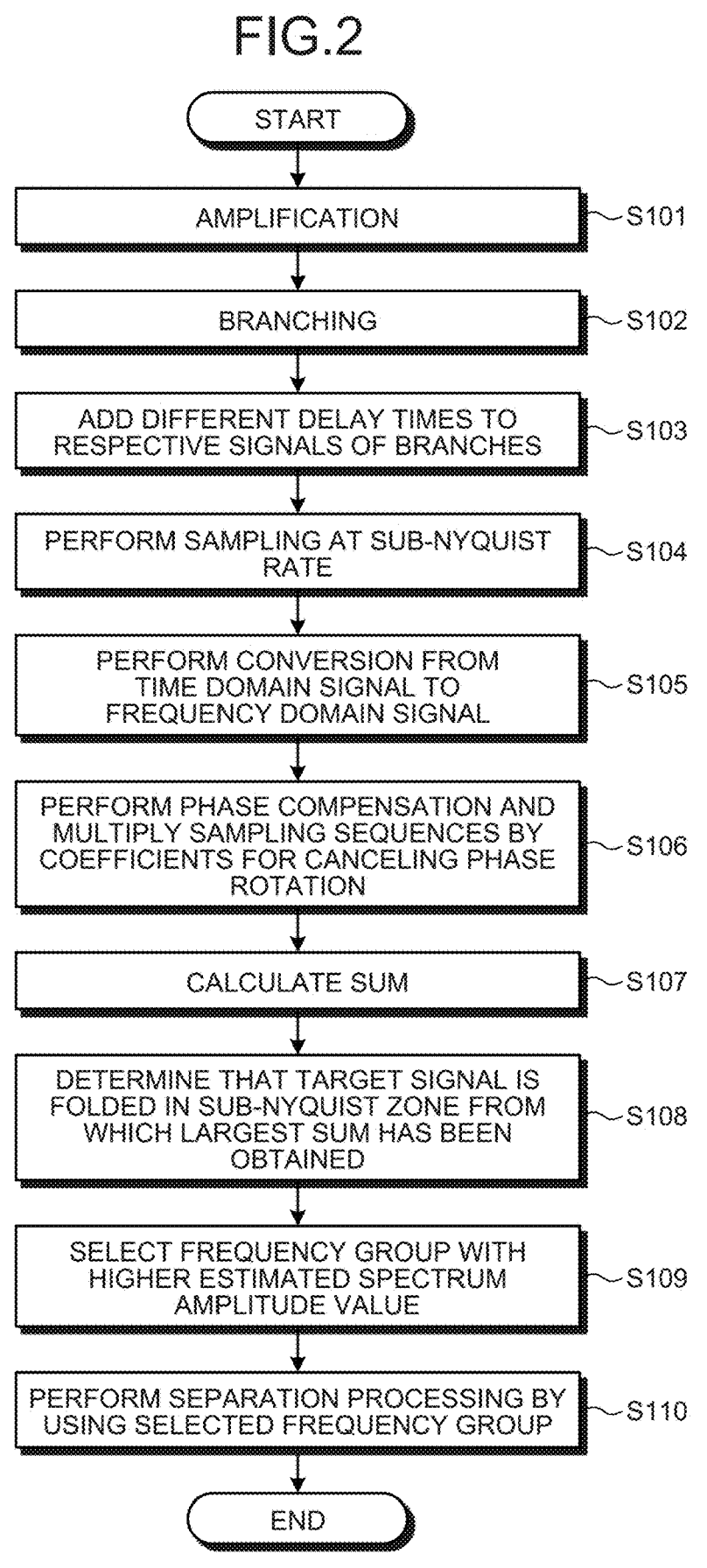

START

↓

AMPLIFICATION — S101

↓

BRANCHING — S102

↓

ADD DIFFERENT DELAY TIMES TO RESPECTIVE SIGNALS OF BRANCHES — S103

↓

PERFORM SAMPLING AT SUB-NYQUIST RATE — S104

↓

PERFORM CONVERSION FROM TIME DOMAIN SIGNAL TO FREQUENCY DOMAIN SIGNAL — S105

↓

PERFORM PHASE COMPENSATION AND MULTIPLY SAMPLING SEQUENCES BY COEFFICIENTS FOR CANCELING PHASE ROTATION — S106

↓

CALCULATE SUM — S107

↓

DETERMINE THAT TARGET SIGNAL IS FOLDED IN SUB-NYQUIST ZONE FROM WHICH LARGEST SUM HAS BEEN OBTAINED — S108

↓

SELECT FREQUENCY GROUP WITH HIGHER ESTIMATED SPECTRUM AMPLITUDE VALUE — S109

↓

PERFORM SEPARATION PROCESSING BY USING SELECTED FREQUENCY GROUP — S110

↓

END

FIG.6

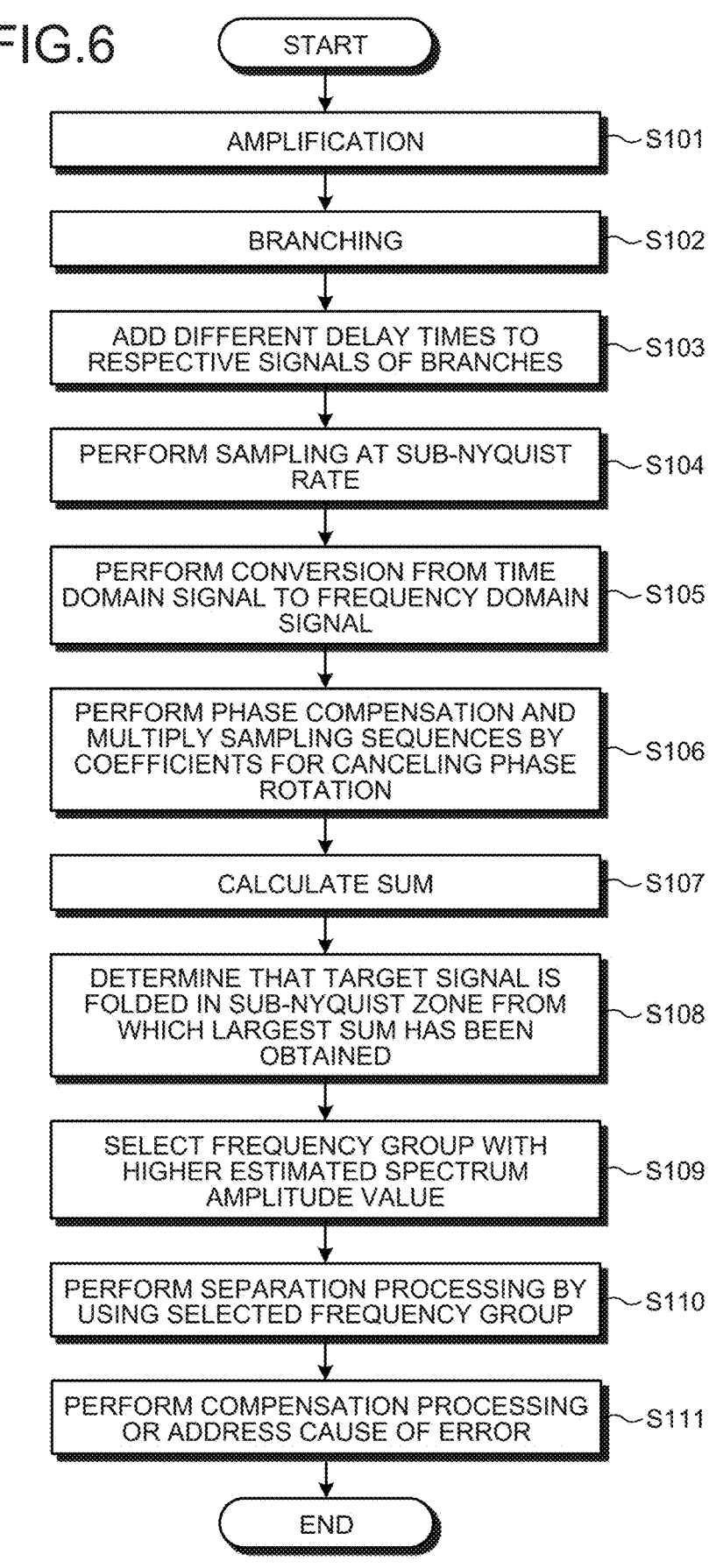

START

AMPLIFICATION — S101

BRANCHING — S102

ADD DIFFERENT DELAY TIMES TO RESPECTIVE SIGNALS OF BRANCHES — S103

PERFORM SAMPLING AT SUB-NYQUIST RATE — S104

PERFORM CONVERSION FROM TIME DOMAIN SIGNAL TO FREQUENCY DOMAIN SIGNAL — S105

PERFORM PHASE COMPENSATION AND MULTIPLY SAMPLING SEQUENCES BY COEFFICIENTS FOR CANCELING PHASE ROTATION — S106

CALCULATE SUM — S107

DETERMINE THAT TARGET SIGNAL IS FOLDED IN SUB-NYQUIST ZONE FROM WHICH LARGEST SUM HAS BEEN OBTAINED — S108

SELECT FREQUENCY GROUP WITH HIGHER ESTIMATED SPECTRUM AMPLITUDE VALUE — S109

PERFORM SEPARATION PROCESSING BY USING SELECTED FREQUENCY GROUP — S110

PERFORM COMPENSATION PROCESSING OR ADDRESS CAUSE OF ERROR — S111

END

SIGNAL ANALYSIS APPARATUS, CONTROL CIRCUIT, STORAGE MEDIUM, AND SIGNAL ANALYSIS METHOD

CROSS-REFERENCE TO RELATED APPLICATION

This application is a continuation application of International Application PCT/JP2021/045613, filed on Dec. 10, 2021, and designating the U.S., the entire contents of which are incorporated herein by reference.

BACKGROUND OF THE INVENTION

1. Field of the Invention

The present disclosure relates to a signal analysis apparatus, a control circuit, a storage medium, and a signal analysis method for analyzing a target signal.

2. Description of the Related Art

A multi-coset sampling (MCS) system has a configuration in which a plurality of analog digital converters (ADCs) operating at a sampling rate lower than a Nyquist rate are arranged in parallel, and there are provided delay differences between respective lines of the ADCs. In recent years, a method for receiving a signal in an MCS system and estimating a frequency of an original signal from a signal folded in a sub-Nyquist zone has been considered. It is possible to detect and analyze a broadband signal by using such a method.

For example, WO 2014/191712 A discloses a method for estimating a frequency of an original signal by performing signal processing using a configuration in which a function of canceling a delay time difference between signals received in an MCS system and processing corresponding to a time-frequency conversion function are collectively performed by means of an FIR filter, then performing a function of performing phase compensation corresponding to each sub-Nyquist zone in signal processing using a complex multiplier, and determining whether the original signal has been folded in the sub-Nyquist zone.

However, according to the above-described conventional technique, a plurality of analog circuits and a plurality of digital circuits are synchronized and operated in combination, and each circuit is a high-speed or large-capacity circuit. Therefore, there has been a problem in that it is difficult to accurately and/or efficiently separate errors occurring in one of these circuits or occurring between these circuits.

The present disclosure has been made in view of the above, and an object of the present disclosure is to obtain a signal analysis apparatus capable of accurately and/or efficiently separating errors.

SUMMARY OF THE INVENTION

To solve the problem and achieve the object described above, a signal analysis apparatus according to the present disclosure comprises: a reception unit to output a plurality of sampling sequences obtained by adding, to respective signals obtained by branching a target signal into a plurality of branches, different delay times and by sampling each of the signals at a sampling rate lower than a Nyquist rate; a time-frequency conversion unit to convert each of the plurality of sampling sequences from a time domain signal to a frequency domain signal; a signal processing unit to collectively perform phase compensation processing and processing for multiplying the sampling sequences by coefficients that cancel phase rotation caused by delay time differences between the sampling sequences, the phase compensation processing corresponding to sub-Nyquist zones of each of the sampling sequences converted into a frequency domain signal; a frequency estimation unit to estimate a frequency of the target signal by determining a sub-Nyquist zone in which the target signal has been folded; a frequency selection unit to select a frequency group with a higher estimated spectrum amplitude value based on a sum of values for each of the sub-Nyquist zones, the values being obtained by multiplication of the sampling sequences by the corresponding coefficients; and a separation unit to perform separation processing for separation of at least one of a cause of an error or an error portion in the target signal by using the frequency group selected by the frequency selection unit.

BRIEF DESCRIPTION OF THE DRAWINGS

FIG. 2 is a flowchart for describing operation of the signal analysis apparatus illustrated in FIG. 1;

FIG. 6 is a flowchart for describing operation of the signal analysis apparatuses according to the second to fourth embodiments;

DETAILED DESCRIPTION OF THE PREFERRED EMBODIMENTS

Hereinafter, signal analysis apparatuses, a control circuit, a storage medium, and a signal analysis method according to embodiments of the present disclosure will be described in detail with reference to the drawings. Note that the technical scope of the present disclosure is not limited by the following embodiments.

First Embodiment

Figure 1:
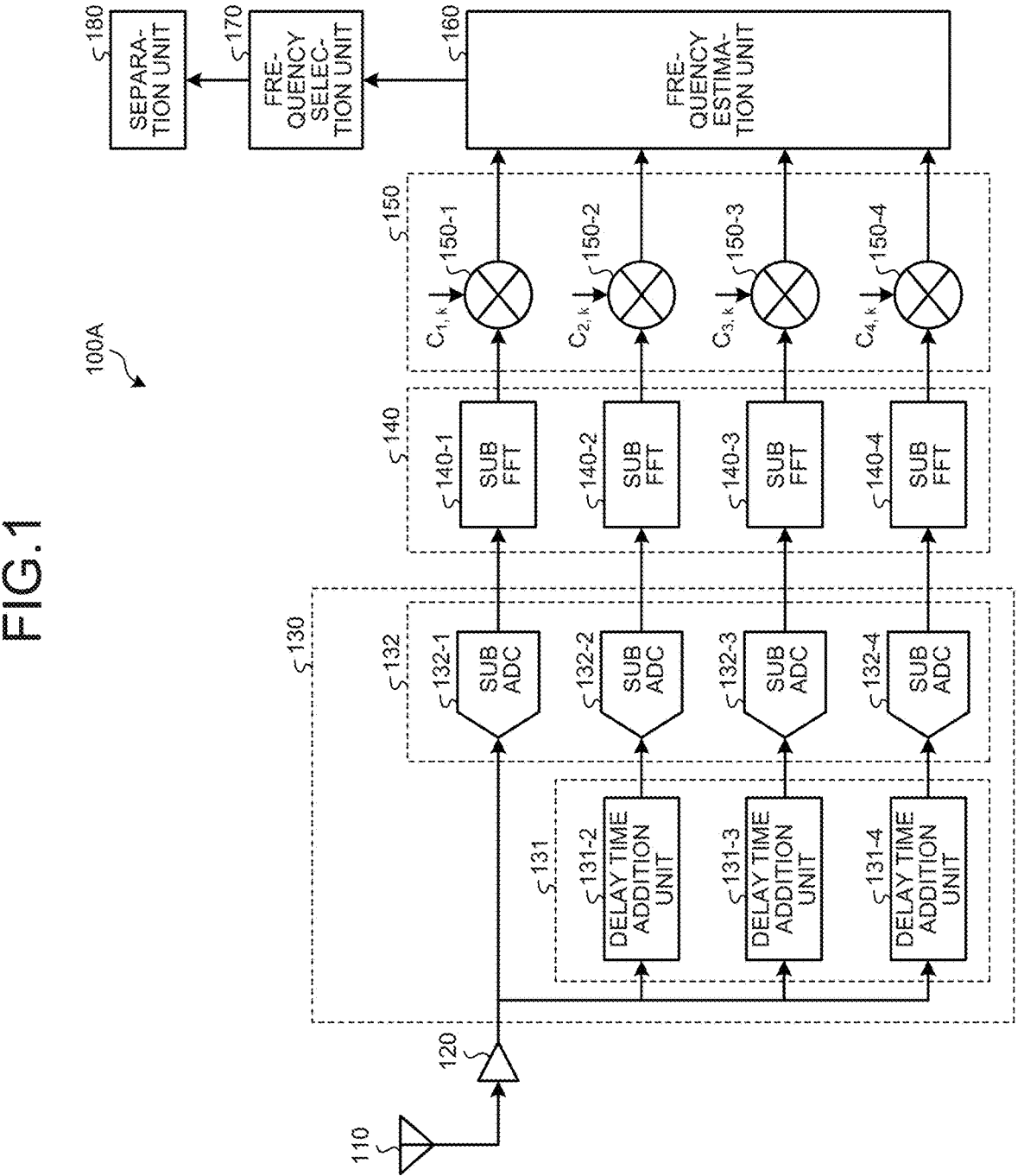
FIG. 1 is a diagram illustrating a configuration of a signal analysis apparatus according to a first embodiment.

FIG. 1 is a diagram illustrating a configuration of a signal analysis apparatus 100A according to a first embodiment. The signal analysis apparatus 100A includes an antenna unit 110, an amplification unit 120, a reception unit 130, a time-frequency conversion unit 140, a signal processing unit 150, a frequency estimation unit 160, a frequency selection unit 170, and a separation unit 180.

The antenna unit 110 receives an electromagnetic wave signal, and outputs the received signal to the amplification unit 120. The amplification unit 120 is an amplifier that amplifies the received signal output from the antenna unit 110, and outputs the received signal that has been amplified to the reception unit 130. The received signal is an example of a target signal that is a signal to be analyzed.

The reception unit 130 outputs a plurality of sampling sequences obtained by adding, to respective signals obtained by branching a target signal into a plurality of branches, different delay times and by sampling each of the signals at a sampling rate lower than a Nyquist rate. The reception unit 130 includes a delay time addition unit 131 and a sampling unit 132. The delay time addition unit 131 adds different delay times to respective signals obtained as a result of branching a target signal into the plurality of branches. The sampling unit 132 outputs sampling sequences obtained by sampling each of the signals to which the different delay times have been added, at a sampling rate lower than the Nyquist rate. Specifically, the delay time addition unit 131 includes delay time addition units 131-2 to 131-4 the number of which is one less than the number of branches. Note that, here, the number of delay time addition units 131 is set to a number that is one less than the number of branches, but the reception unit 130 may include the delay time addition units 131 as many as the number of branches. In a case where the number of delay time addition units 131 is set to a number that is one less than the number of branches so as to simplify the configuration, it is possible to achieve effects of improving power consumption, cost, size, and reliability of a circuit. The delay time addition units 131-2 to 131-4 are delay elements, for example. The sampling unit 132 includes sub analog digital converters (ADCs) 132-1 to 132-4 as many as the number of branches. The sub ADCs 132-1 to 132-4 are provided such that there is a one-to-one correspondence between the sub ADCs 132-1 to 132-4 and the plurality of branches. One of the respective signals of the plurality of branches is directly input to the sub ADC 132-1. Meanwhile, different delay times are added to signals of the remaining three branches in the delay time addition units 131-2 to 131-4 and then, the signals of the remaining three branches are input to the sub ADCs 132-2 to 132-4, respectively. Each of the sub ADCs 132-1 to 132-4 samples an input signal, and outputs a sampling sequence. Each of the sub ADCs 132-1 to 132-4 samples an independently input signal, at a sampling rate that is a sub-Nyquist rate corresponding to, for example, 1/20 of the Nyquist rate. In this manner, the reception unit 130 forms an MCS system.

The time-frequency conversion unit 140 includes sub FFTs 140-1 to 140-4 as many as the number of the plurality of branches. The sub FFTs 140-1 to 140-4 are provided such that there is a one-to-one correspondence between the sub FFTs 140-1 to 140-4 and the plurality of branches. A sampling sequence output from the sub ADC 132-1 is input to the sub FFT 140-1, a sampling sequence output from the sub ADC 132-2 is input to the sub FFT 140-2, a sampling sequence output from the sub ADC 132-3 is input to the sub FFT 140-3, and a sampling sequence output from the sub ADC 132-4 is input to the sub FFT 140-4. Each of the sub FFTs 140-1 to 140-4 converts the input sampling sequence from a time domain signal to a signal folded in a frequency domain, and outputs the sampling sequence as a frequency domain signal to the signal processing unit 150.

The signal processing unit 150 collectively performs phase compensation processing corresponding to sub-Nyquist zones of each sampling sequence converted into a frequency domain signal and processing for canceling phase rotation caused by delay time differences between the sampling sequences. The signal processing unit 150 includes complex multipliers 150-1 to 150-4 provided such that there is a one-to-one correspondence between the complex multipliers 150-1 to 150-4 and the plurality of branches. Each of the complex multipliers 150-1 to 150-4 collectively performs, on a corresponding sampling sequence input as a frequency domain signal, the phase compensation processing corresponding to each of the sub-Nyquist zones of K number of sub-Nyquist folds corresponding to 20 which is the ratio between the sub-Nyquist rate and the Nyquist rate, and the processing for canceling phase rotation caused by delay time differences between the sampling sequences by multiplying the sampling sequences by coefficients for canceling the phase rotation. The term "coefficients" refer to a coefficient $C_{1,k}$ by which the complex multiplier 150-1 multiplies a frequency domain signal from the sub FFT 140-1, a coefficient $C_{2,k}$ by which the complex multiplier 150-2 multiplies a frequency domain signal from the sub FFT 140-2, a coefficient $C_{3,k}$ by which the complex multiplier 150-3 multiplies a frequency domain signal from the sub FFT 140-3, and a coefficient $C_{4,k}$ by which the complex multiplier 150-4 multiplies a frequency domain signal from the sub FFT 140-4. Here, $k=1, 2, \ldots, K$.

The frequency estimation unit 160 calculates, for each sub-Nyquist zone, a sum of values obtained by multiplication of the sampling sequences by corresponding coefficients, and determines that the sub-Nyquist zone with a largest sum is a sub-Nyquist zone in which a component of the received signal has been folded, thereby estimating the frequency of the original received signal.

The frequency selection unit 170 calculates a sum of values obtained by multiplication of the sampling sequences by the above-described coefficients $C_{1,k}$, $C_{2,k}$, $C_{3,k}$, and $C_{4,k}$ for each sub-Nyquist zone number k. Then, the frequency selection unit 170 selects a frequency group with a higher estimated spectrum amplitude value by using information regarding the magnitude of the sum which indicates a largest sum. Here, in order to improve the efficiency of calculation, the frequency selection unit 170 may select a frequency group with a higher estimated spectrum amplitude value by diverting information regarding the magnitude of the sum obtained by the frequency estimation unit 160 when determining a sub-Nyquist zone with the largest sum. For example, the information regarding the magnitude of the sum may be an absolute value of the sum that is a complex number. Alternatively, calculation of taking a square root for obtaining the absolute value may be omitted, and the square of the absolute value of the sum may be used. It is possible to reduce an operation load by omitting the calculation of taking a square root. Furthermore, when selecting a higher frequency group based on the information regarding the magnitude of the sum, the frequency selection unit 170 selects a higher frequency group by a sorting algorithm based on the ranking of the magnitude of each sum. At this time, the frequency selection unit 170 can reduce calculation accuracy of the sorting algorithm or the above-described square calculation by giving priority to calculation efficiency, or perform an approximation calculation by, for example, terminating sorting at an appropriate number of times. In addition, the frequency selection unit 170 just needs to select a higher frequency group, and does not necessarily need to determine rankings in the higher frequency group. Therefore, for example, a threshold search for dividing the higher group may be performed so as to simplify the sorting algorithm itself.

The separation unit 180 performs separation processing for separation of at least one of a cause of an error or an error portion on the basis of the frequency group selected by the frequency selection unit 170. The cause of an error refers to, for example, a physical system error such as a sampling phase error, or a logical error such as a soft error.

FIG. 2 is a flowchart for describing operation of the signal analysis apparatus 100A illustrated in FIG. 1. When a signal is received by the antenna unit 110, the signal analysis apparatus 100A amplifies the received signal in the amplification unit 120 (step S101). The received signal that has been amplified is input to the reception unit 130, and is branched into signals of a plurality of branches (step S102). The delay time addition unit 131 of the reception unit 130 adds different delay times to the respective signals of the branches (step S103). The sampling unit 132 of the reception unit 130 samples the signal of each branch to which the delay time has been added, at the sub-Nyquist rate which is a sampling rate lower than the Nyquist rate (step S104). Each of a plurality of sampling sequences output from the reception unit 130 is converted from a time domain signal to a frequency domain signal in the time-frequency conversion unit 140 (step S105).

The complex multipliers 150-1 to 150-4 of the signal processing unit 150 collectively perform phase compensation and processing for multiplying the sampling sequences by coefficients for canceling phase rotation (step S106). The frequency estimation unit 160 calculates a sum of values obtained by multiplication of the sampling sequences by the above-described coefficients for each sub-Nyquist zone (step S107). The frequency estimation unit 160 determines that the target signal is folded in a sub-Nyquist zone from which a largest sum has been obtained (step S108).

The frequency selection unit 170 selects a frequency group with a higher estimated spectrum amplitude value based on the sum described above (step S109). The separation unit 180 performs separation processing by using the selected frequency group (step S110).

As described above, according to the first embodiment, each of respective signals of a plurality of branches generated by branching a received signal is sampled at a sampling rate lower than the Nyquist rate, and different delay times are added to the respective signals of the plurality of branches to form a plurality of sampling sequences, in the signal analysis apparatus 100A that estimates the frequency of the received signal that is a target signal. After each of the plurality of sampling sequences is converted from a time domain signal to a frequency domain signal, the phase compensation processing and the processing for canceling phase rotation caused by delay time differences are collectively performed in the frequency domain, and a sub-Nyquist zone in which a component of the target signal has been folded is determined. Thus, the frequency of the original received signal is estimated. In the signal analysis apparatus 100A described above, the frequency selection unit 170 selects a frequency group with a higher estimated spectrum amplitude value on the basis of the sum of values obtained by multiplication of the sampling sequences by the above-described coefficients, calculated for each sub-Nyquist zone. Then, the separation unit 180 performs separation processing for separation of a cause of an error or an error portion in the received signal by using the selected frequency group. Therefore, it is possible to reduce the amount of calculation required for error determination or improve error determination accuracy compared to other cases requiring the same amount of calculation. Thus, it is possible to accurately and/or efficiently separate errors.

Second Embodiment

Figure 3:
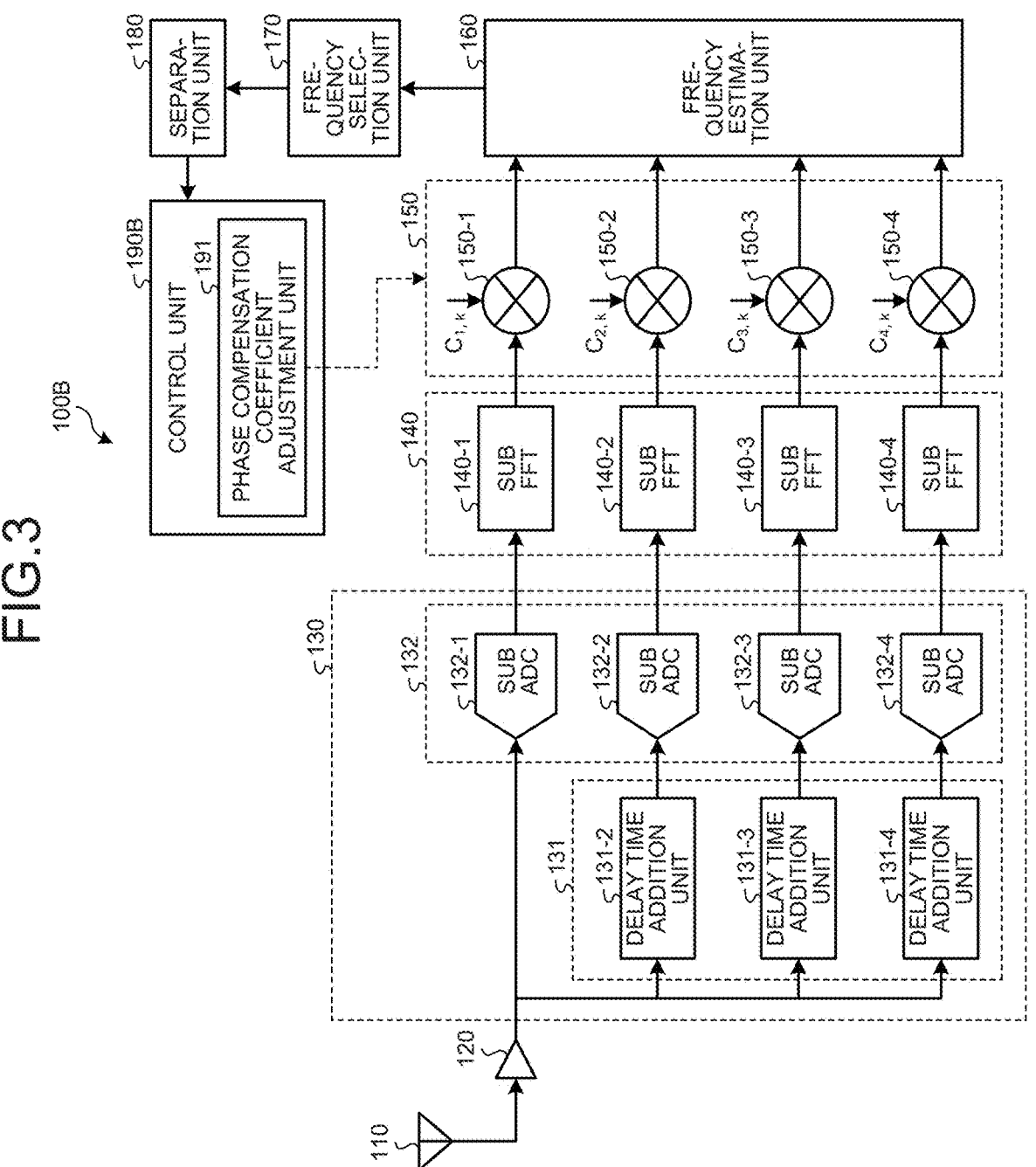
FIG. 3 is a diagram illustrating a configuration of a signal analysis apparatus according to a second embodiment.

FIG. 3 is a diagram illustrating a configuration of a signal analysis apparatus 100B according to a second embodiment. In addition to the configuration of the signal analysis apparatus 100A according to the first embodiment, the signal analysis apparatus 100B includes a control unit 190B that handles an error on the basis of separation information that is a result of separation processing performed by the separation unit 180. In the second embodiment, the control unit 190B includes a phase compensation coefficient adjustment unit 191. Hereinafter, description of portions similar to those of the first embodiment will be omitted, and differences from the first embodiment will be mainly described.

The separation unit 180 performs determination as to a sampling phase error based on a frequency group selected by the frequency selection unit 170. The separation unit 180 generates separation information indicating a result of determination as to a sampling phase error, and outputs the generated separation information to the control unit 190B.

The phase compensation coefficient adjustment unit 191 of the control unit 190B performs sampling phase error compensation by adjusting the coefficients $C_{1,k}$, $C_{2,k}$, $C_{3,k}$, and $C_{4,k}$, which are phase compensation coefficients to be used by the signal processing unit 150. The phase compensation coefficient adjustment unit 191 outputs the adjusted coefficients $C_{1,k}$, $C_{2,k}$, $C_{3,k}$, and $C_{4,k}$ to the signal processing unit 150.

Third Embodiment

Figure 4:
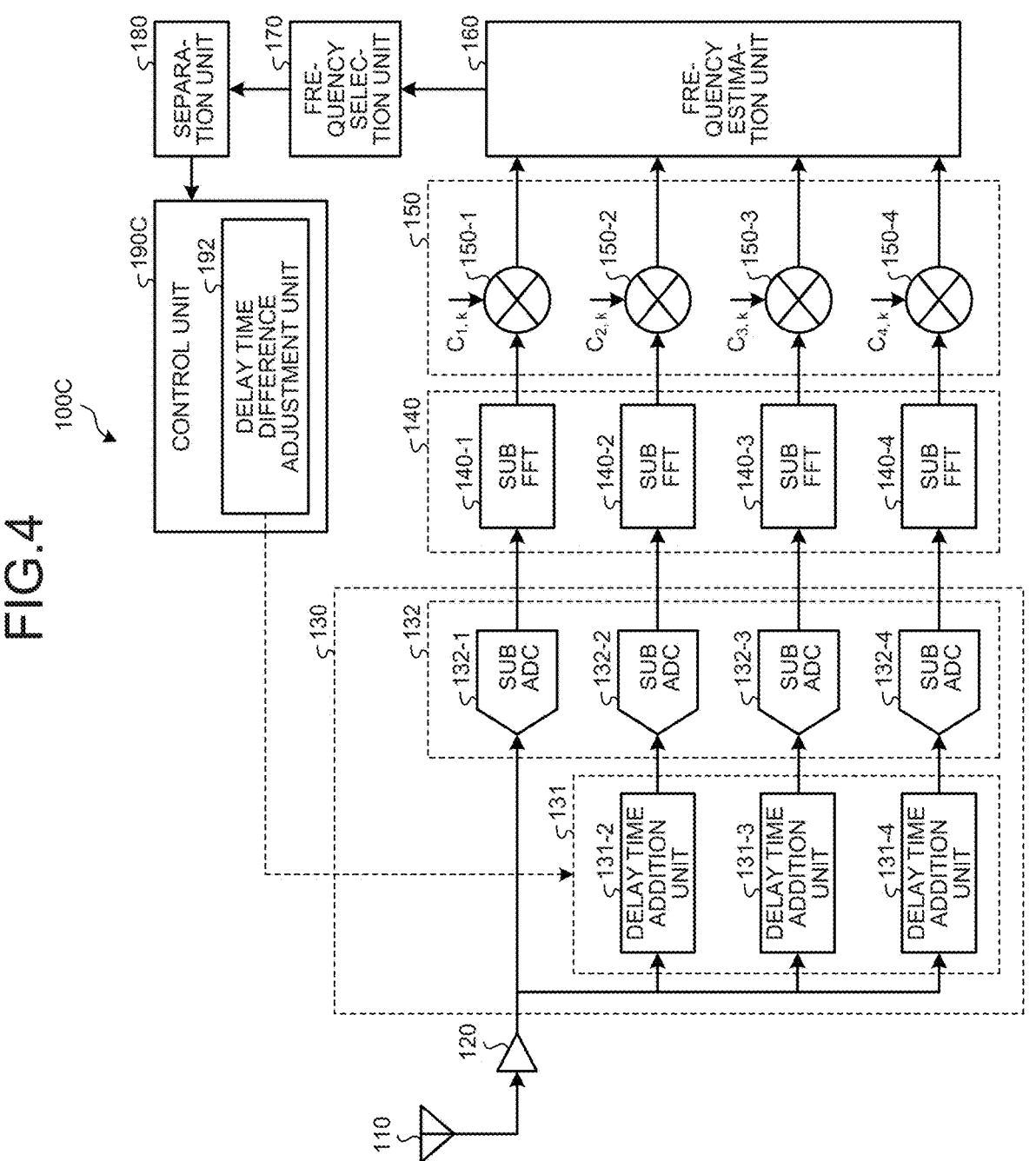
FIG. 4 is a diagram illustrating a configuration of a signal analysis apparatus according to a third embodiment.

FIG. 4 is a diagram illustrating a configuration of a signal analysis apparatus 100C according to a third embodiment. The signal analysis apparatus 100C includes a delay time difference adjustment unit 192 instead of the phase compensation coefficient adjustment unit 191 of the signal analysis apparatus 100B according to the second embodiment. Hereinafter, description of portions similar to those of the second embodiment will be omitted, and differences from the second embodiment will be mainly described.

The separation unit 180 performs determination as to a sampling phase error by using a frequency group selected by the frequency selection unit 170 as in the second embodiment. The separation unit 180 generates separation information indicating a result of determination as to a sampling phase error, and outputs the generated separation information to a control unit 190C.

The delay time difference adjustment unit 192 of the control unit 190C performs sampling phase error compensation by adjusting delay times to be added by the delay time addition unit 131, on the basis of the separation information generated by the separation unit 180, the separation information indicating the result of determination as to a sampling phase error.

Fourth Embodiment

Figure 5:
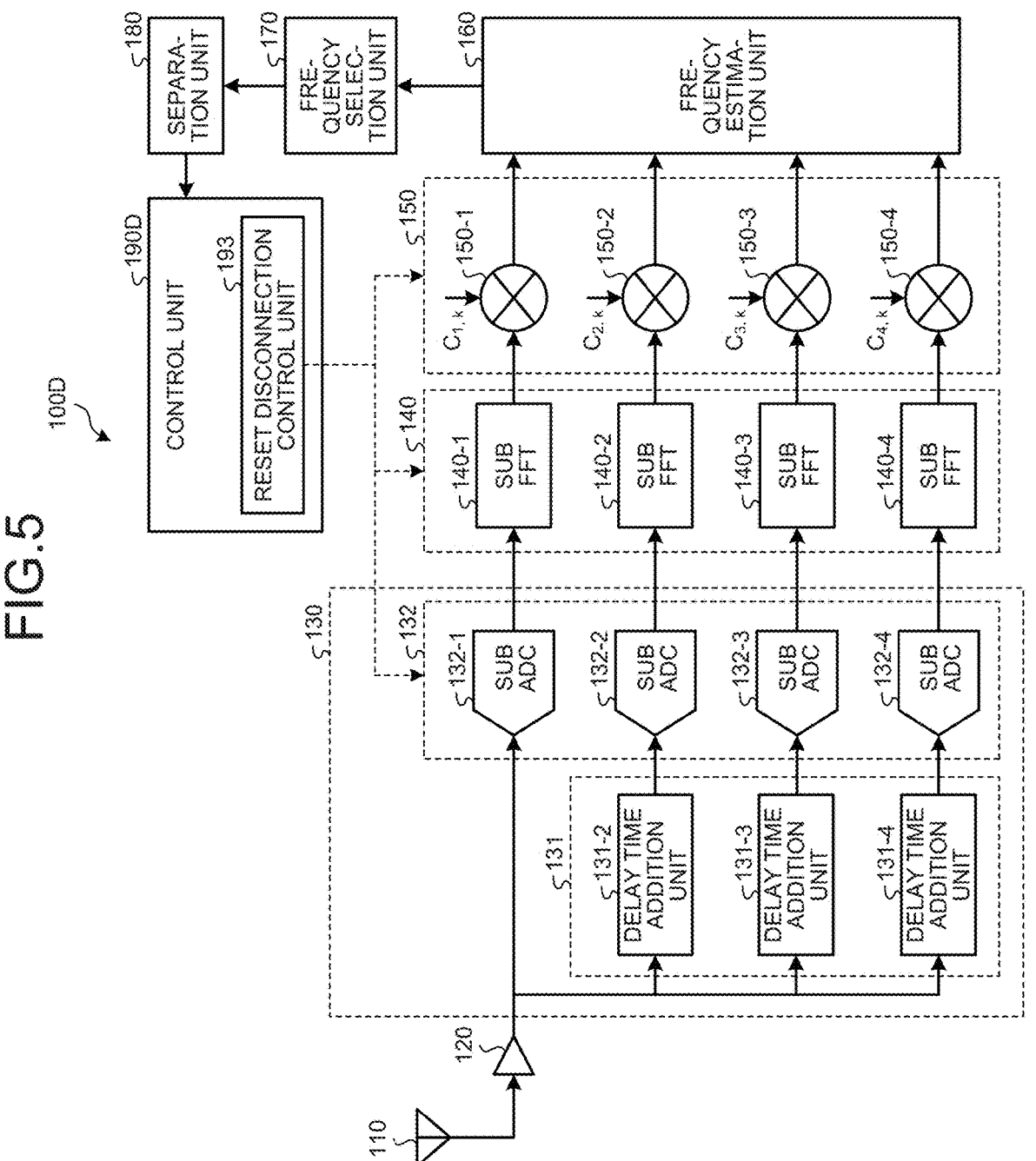
FIG. 5 is a diagram illustrating a configuration of a signal analysis apparatus according to a fourth embodiment.

FIG. 5 is a diagram illustrating a configuration of a signal analysis apparatus 100D according to a fourth embodiment. The signal analysis apparatus 100D includes a reset disconnection control unit 193 instead of the phase compensation coefficient adjustment unit 191 of the signal analysis apparatus 100B according to the second embodiment. Hereinafter, differences from the second embodiment will be mainly described.

The separation unit 180 performs determination as to a logical error and separation of an error portion by using a frequency group selected by the frequency selection unit 170, generates separation information that is a result of the separation processing, and outputs the generated separation information to a control unit 190D.

On the basis of the separation information, the reset disconnection control unit 193 of the control unit 190D takes measures including at least one of resetting, restarting, rewriting, or disconnection of a circuit where an error has occurred. The circuit where an error has occurred corresponds to at least one of, for example, the sub ADCs 132-1 to 132-4 which are analog-to-digital conversion circuits included in the reception unit 130, the sub FFTs 140-1 to 140-4 which are time-frequency conversion circuits included in the time-frequency conversion unit 140, or the complex multipliers 150-1 to 150-4 included in the signal processing unit 150. Furthermore, in a case where the delay time addition unit 131 included in the reception unit 130 includes a delay element that is a delay time addition circuit and a control circuit that controls the delay element, and the control circuit is an ADC that generates an analog voltage for controlling the delay element, the reset disconnection control unit 193 may take measures including at least one of resetting, restarting, rewriting, or disconnection of the delay time addition circuit and the control circuit for the delay time addition circuit. In a failure mode resulting from a certain type of soft error, it is thus possible to achieve the effect of returning to a normal operation mode by taking measures such as resetting, restarting, and rewriting for a circuit portion where an error has occurred, such as an ADC, an application specific integrated circuit (ASIC), a field-programmable gate array (FPGA), and a graphics processing unit (GPU).

In addition, in the case of a failure mode resulting from more serious failure that does not allow the operation mode to be returned to the normal operation mode by the above-described measures such as resetting, restarting, and rewriting, or in the case where it is not desired to wait until the operation mode returns to the normal operation mode by taking measures such as resetting, restarting, and rewriting, disconnection of a circuit portion in which an error has occurred is also an effective measure. For example, the reset disconnection control unit 193 may disconnect the circuit portion in which the error has occurred from the beginning, or may disconnect the circuit portion in which the error has occurred in a case where the operation mode cannot be returned to the normal operation mode even if measures such as resetting, restarting, and rewriting are taken.

Note that the reset disconnection control unit 193 may perform disconnection processing by stopping a circuit portion in which an error has occurred, or may perform disconnection processing by setting the coefficients $C_{1,k}$, $C_{2,k}$, $C_{3,k}$, and $C_{4,k}$ of the relevant circuit portion to 0.

Furthermore, the reset disconnection control unit 193 may perform the disconnection processing in parallel with measures such as resetting, restarting, and rewriting. In this case, when the operation mode can be returned to the normal operation mode, the reset disconnection control unit 193 can cancel the disconnection and resume the optimum frequency estimation.

FIG. 6 is a flowchart for describing operation of the signal analysis apparatuses 100B to 100D according to the second to fourth embodiments. Since steps S101 to S110 are the same as those in FIG. 2, description thereof is omitted. Note that in a case where it is not necessary to distinguish the control units 190B to 190D, the control units 190B to 190D are each simply referred to as a control unit 190. After separation processing is performed in step S110, the control unit 190 performs error compensation processing and/or addresses a cause of an error (step S111). In step S111, the control unit 190B adjusts the coefficients $C_{1,k}$, $C_{2,k}$, $C_{3,k}$, and $C_{4,k}$, which are phase compensation coefficients, the control unit 190C adjusts delay times to be added by the delay time addition unit 131, and the control unit 190D performs at least one of resetting, restarting, rewriting, or disconnection of a circuit in which an error has occurred.

Fifth Embodiment

Figure 7:
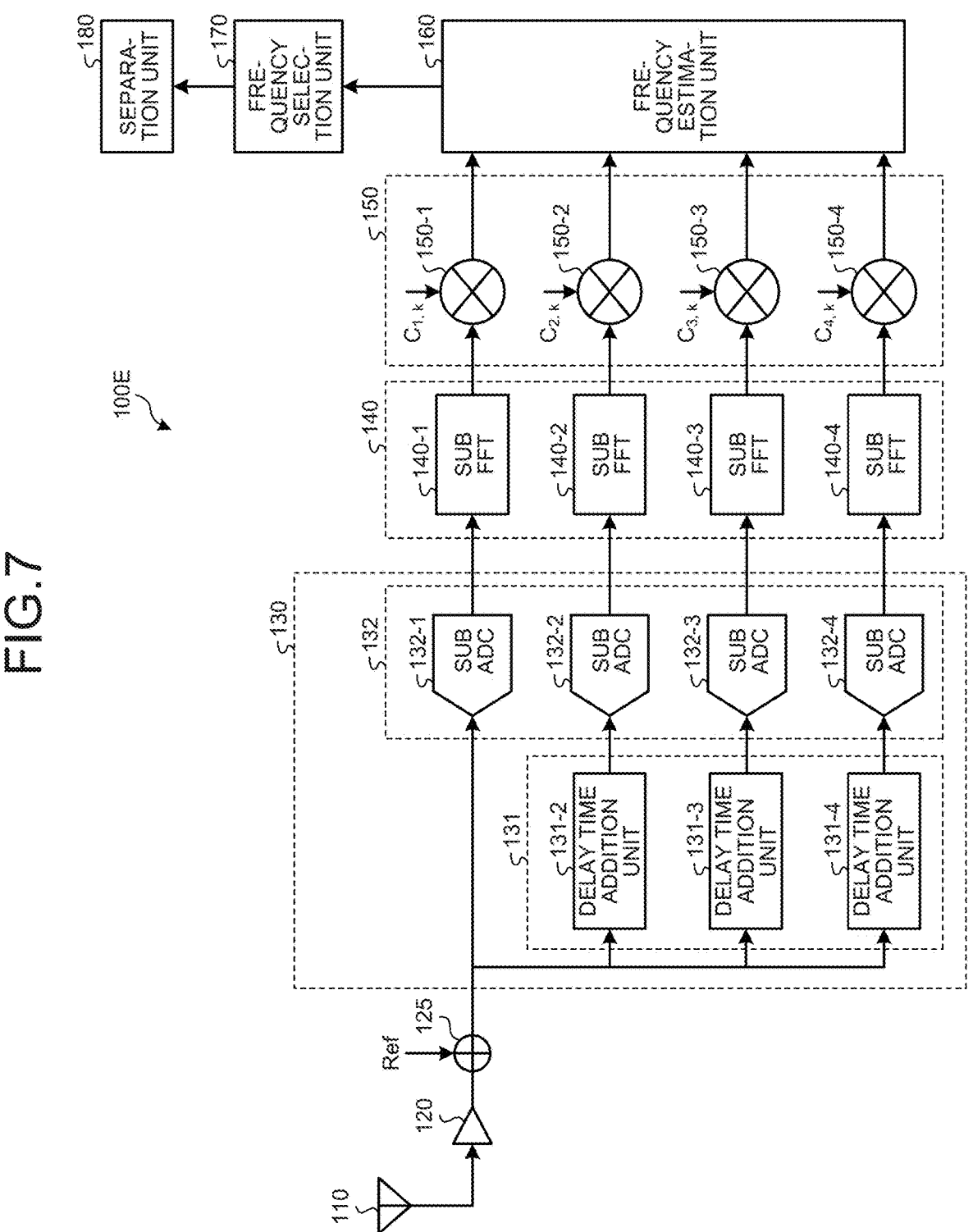
FIG. 7 is a diagram illustrating a configuration of a signal analysis apparatus according to a fifth embodiment.

FIG. 7 is a diagram illustrating a configuration of a signal analysis apparatus 100E according to a fifth embodiment. The signal analysis apparatus 100E includes a reference signal addition unit 125 in addition to the configuration of the signal analysis apparatus 100A according to the first embodiment. Hereinafter, description of portions similar to those of the signal analysis apparatus 100A will be omitted, and differences from the signal analysis apparatus 100A will be mainly described.

The reference signal addition unit 125 is disposed between the amplification unit 120 and the reception unit 130, and adds a reference signal to a received signal before the received signal is branched into signals of a plurality of branches. The reference signal is desirably, for example, a signal having frequency distribution and intensity that is less likely to collide with the received signal on a frequency axis. In addition, in a case where it is possible to perform good error estimation even without the reference signal, the reference signal addition unit 125 may appropriately stop inputting the reference signal.

The signal analysis apparatus 100E includes the reference signal addition unit 125. As a result, the signal analysis apparatus 100E can perform separation of a cause of an error or an error portion by using the reference signal. Therefore, it is possible to improve the accuracy of separation processing to be performed by the separation unit 180.

Note that although FIG. 7 illustrates a configuration in which the reference signal addition unit 125 has been added to the configuration of the signal analysis apparatus 100A according to the first embodiment, the reference signal addition unit 125 may be added to the configurations of the signal analysis apparatuses 100B to 100D according to the second to fourth embodiments.

Sixth Embodiment

The first to fifth embodiments described above assume that the delay time addition units 131-2 to 131-4 are delay elements, but in a sixth embodiment, the delay time addition units 131-2 to 131-4 are track-and-hold circuits. Also in this case, an MCS system can be configured.

Seventh Embodiment

In a seventh embodiment, it is possible to configure an MCS system by taking out a signal corresponding to an appropriate delay time difference from signals sampled by Nyquist rate ADCs, so as to provide a delay time difference to sampling timing in the configurations of the first to sixth embodiments described above.

Eighth Embodiment

In an eighth embodiment, as a result of performing frequency estimation for all combinations of branches drawn from the plurality of branches, the number of the drawn branches being one less than the number of the plurality of branches, the separation unit 180 in the configurations of the first to seventh embodiments described above can determine that a branch not included in a combination that maximizes an estimated spectrum amplitude value obtained as a result of the frequency estimation is a branch in which an error has occurred. Alternatively, the separation unit 180 can also determine that a branch with a largest deviation from an average complex amplitude value is a branch in which an error has occurred.

Ninth Embodiment

In a ninth embodiment, the phase compensation coefficient adjustment unit 191 in the configuration of the second embodiment described above can adjust the coefficients such that a deviation from an average complex amplitude value is reduced for each branch, as a result of performing frequency estimation for the plurality of branches. Alternatively, in the configuration of the third embodiment described above, the delay time difference adjustment unit 192 can adjust the delay times such that a deviation from an average complex amplitude value is reduced for each branch, as a result of performing frequency estimation for the plurality of branches.

Tenth Embodiment

In a tenth embodiment, the frequency estimation unit 160 stores interim information in the configurations of the first to ninth embodiments described above. The interim information includes at least the coefficients $C_{1,k}$, $C_{2,k}$, $C_{3,k}$, and $C_{4,k}$, information regarding values obtained by multiplication of sampling sequences by the corresponding coefficients $C_{1,k}$, $C_{2,k}$, $C_{3,k}$, and $C_{4,k}$, or information regarding the sum of the values. The frequency selection unit 170 and the separation unit 180 can reuse the stored interim information. Note that, in a case where the interim information is stored, each of the frequency selection unit 170 and the separation unit 180 can select information to be used according to required information accuracy. For example, the frequency selection unit 170 may select a higher frequency group on the basis of the ranking of the square value of the magnitude of the sum, which is information regarding the magnitude of the sum, and the separation unit 180 may perform calculation by using an original complex amplitude value exclusively for a frequency group including a relatively small number of frequencies, selected by the frequency selection unit 170.

Figure 8:
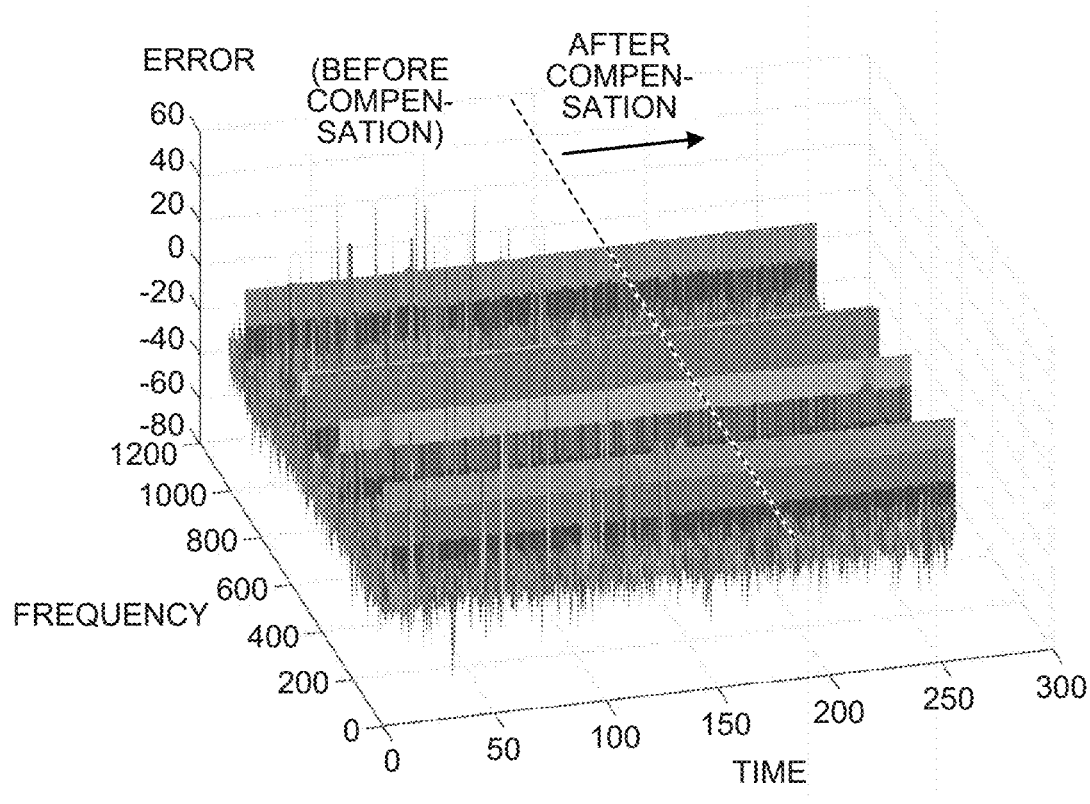
FIG. 8 is a diagram illustrating an effect to be obtained in a case where sampling phase compensation is performed in the first to tenth embodiments described above.

FIG. 8 is a diagram illustrating an effect to be obtained in a case where sampling phase compensation is performed in the first to tenth embodiments described above. In FIG. 8, a portion in which sampling phase compensation has been performed is shown on the right side of a time axis, and a portion in which sampling phase compensation has yet to be performed is shown on the left side. FIG. 8 shows that sampling phase compensation brings about the effect of reducing errors compared to before the sampling phase compensation, particularly in a portion where no signal originally exists.

Next, hardware configurations of the signal analysis apparatuses 100A to 100E according to the first to tenth embodiments will be described. The respective functions of the units of each of the signal analysis apparatuses 100A to 100E are implemented by processing circuitry. The processing circuitry may be implemented by dedicated hardware, or may be a control circuit using a central processing unit (CPU).

Figure 9:
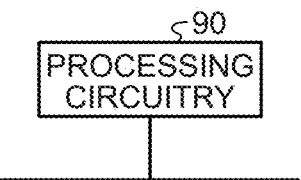
FIG. 9 is a diagram illustrating dedicated hardware for implementing functions of signal analysis apparatuses according to the first to tenth embodiments.

When implemented by dedicated hardware, the above-described processing circuitry is implemented by processing circuitry 90 illustrated in FIG. 9. FIG. 9 is a diagram illustrating dedicated hardware for implementing the functions of the signal analysis apparatuses 100A to 100E according to the first to tenth embodiments. The processing circuitry 90 is a single circuit, a composite circuit, a programmed processor, a parallel-programmed processor, an ASIC, an FPGA, or a combination thereof.

Figure 10:
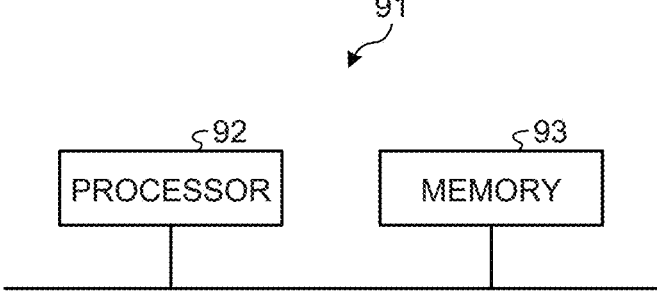
FIG. 10 is a diagram illustrating a configuration of a control circuit for implementing the functions of the signal analysis apparatuses according to the first to tenth embodiments.

In a case where the above-described processing circuitry is implemented by a control circuit using a CPU, this control circuit is, for example, a control circuit 91 with a configuration illustrated in FIG. 10. FIG. 10 is a diagram illustrating a configuration of the control circuit 91 for implementing the functions of the signal analysis apparatuses 100A to 100E according to the first to tenth embodiments. As illustrated in FIG. 10, the control circuit 91 includes a processor 92 and a memory 93. The processor 92 is a CPU, and is also called an arithmetic device, a microprocessor, a microcomputer, a digital signal processor (DSP), or the like. Examples of the memory 93 include nonvolatile or volatile semiconductor memories such as a random access memory (RAM), a read only memory (ROM), a flash memory, an erasable programmable ROM (EPROM), and an electrically EPROM (EEPROM (registered trademark)), a magnetic disk, a flexible disk, an optical disk, a compact disk, a mini disk, and a digital versatile disk (DVD).

In a case where the above-described processing circuitry is implemented by the control circuit 91, the processing circuitry is implemented by the processor 92 reading and executing a program corresponding to processing to be performed by each constituent element, stored in the memory 93. The memory 93 is also used as a temporary memory in each processing to be executed by the processor 92. Note that the programs to be executed by the control circuit 91 may be provided by being stored on a storage medium, or may be provided via a communication path.

The signal analysis apparatus according to the present disclosure has an effect of enabling errors to be accurately and/or efficiently separated.

The configurations set forth in the above embodiments show examples, and it is possible to combine the configurations with another known technique or combine the embodiments with each other, and is also possible to partially omit or change the configurations without departing from the scope of the present disclosure.

What is claimed is:

1. A signal analysis apparatus comprising:

reception circuitry to output a plurality of sampling sequences obtained by adding, to respective signals obtained by branching a target signal into a plurality of branches, different delay times and by sampling each of the signals at a sampling rate lower than a Nyquist rate;

time-frequency conversion circuitry to convert each of the plurality of sampling sequences from a time domain signal to a frequency domain signal;

signal processing circuitry to collectively perform phase compensation processing and processing for multiplying the sampling sequences by coefficients that cancel phase rotation caused by delay time differences between the sampling sequences, the phase compensation processing corresponding to sub-Nyquist zones of each of the sampling sequences converted into a frequency domain signal;

frequency estimation circuitry to estimate a frequency of the target signal by determining a sub-Nyquist zone in which the target signal has been folded;

frequency selection circuitry to select a frequency group with a higher estimated spectrum amplitude value based on a sum of values for each of the sub-Nyquist zones, the values being obtained by multiplication of the sampling sequences by the corresponding coefficients; and separation circuitry to perform separation processing for separation of at least one of a cause of an error or an error portion in the target signal by using the frequency group selected by the frequency selection circuitry.

2. The signal analysis apparatus according to claim 1, further comprising:

a controller to handle the error based on separation information that is a result of the separation processing.

3. The signal analysis apparatus according to claim 2, wherein the controller includes a phase compensation coefficient adjustment circuitry to adjust the coefficients based on the separation information.

4. The signal analysis apparatus according to claim 2, wherein the controller includes a delay time difference adjustment circuitry to adjust the delay times to be added by the reception circuitry, based on the separation information.

5. The signal analysis apparatus according to claim 2, wherein based on the separation information, the controller takes measures including at least one of resetting, restarting, rewriting, or disconnection of at least one of a delay time addition circuit included in the reception circuitry and a control circuit for the delay time addition circuit, an analog-to-digital conversion circuit included in the reception circuitry, a time-frequency conversion circuit included in the time-frequency conversion circuitry, or a complex multiplier included in the signal processing circuitry.

6. The signal analysis apparatus according to claim 1, wherein the frequency estimation circuitry stores interim information including at least one of the values obtained by multiplication of the sampling sequences by the corresponding coefficients or a sum of the values, and the frequency selection circuitry and the separation circuitry reuse the interim information.

7. The signal analysis apparatus according to claim 1, wherein as a result of performing frequency estimation for all combinations of branches drawn from the plurality of branches, a number of the drawn branches being one less than a number of the plurality of branches, the separation circuitry determines that a branch not included in a combination that maximizes the estimated spectrum amplitude value obtained as a result of the frequency estimation is a branch in which an error has occurred.

8. The signal analysis apparatus according to claim 1, wherein the separation circuitry determines that a branch with a largest deviation from an average complex amplitude value of the plurality of branches is a branch in which an error has occurred, the branch with the largest deviation being any of the plurality of branches.

9. The signal analysis apparatus according to claim 3, wherein the phase compensation coefficient adjustment circuitry performs frequency estimation for the plurality of branches, and adjusts the coefficients such that a deviation from an average complex amplitude value is reduced for each of the branches.

10. The signal analysis apparatus according to claim 4, wherein the delay time difference adjustment circuitry performs frequency estimation for the plurality of branches, and adjusts the delay times such that a deviation from an average complex amplitude value is reduced for each of the branches.

11. The signal analysis apparatus according to claim 1, further comprising reference signal addition circuitry to add a reference signal to the target signal before the target signal is branched into the plurality of branches.

12. The signal analysis apparatus according to claim 1, wherein the reception circuitry adds the delay times by a track-and-hold circuit.

13. A control circuit for controlling a signal analysis apparatus that outputs a plurality of sampling sequences obtained by adding, to respective signals obtained by branching a target signal into a plurality of branches, different delay times and by sampling each of the signals at a sampling rate lower than a Nyquist rate, converts each of the plurality of sampling sequences from a time domain signal to a frequency domain signal, collectively performs phase compensation processing and processing for multiplying the sampling sequences by coefficients that cancel phase rotation caused by delay time differences between the sampling sequences, the phase compensation processing corresponding to sub-Nyquist zones of each of the sampling sequences converted into a frequency domain signal, and estimates a frequency of the target signal by determining a sub-Nyquist zone in which the target signal has been folded, the control circuit causing the signal analysis apparatus to perform:

selecting a frequency group with a higher estimated spectrum amplitude value based on a sum of values for each of the sub-Nyquist zones, the values being obtained by multiplication of the sampling sequences by the corresponding coefficients; and performing separation processing for separation of at least one of a cause of an error or an error portion in the target signal by using the selected frequency group.

14. A non-transitory storage medium with a program stored thereon, the program being for controlling a signal analysis apparatus that outputs a plurality of sampling sequences obtained by adding, to respective signals obtained by branching a target signal into a plurality of branches, different delay times and by sampling each of the signals at a sampling rate lower than a Nyquist rate, converts each of the plurality of sampling sequences from a time domain signal to a frequency domain signal, collectively performs phase compensation processing and processing for multiplying the sampling sequences by coefficients that cancel phase rotation caused by delay time differences between the sampling sequences, the phase compensation processing corresponding to sub-Nyquist zones of each of the sampling sequences converted into a frequency domain signal, and estimates a frequency of the target signal by determining a sub-Nyquist zone in which the target signal has been folded, the program causing the signal analysis apparatus to perform:

selecting a frequency group with a higher estimated spectrum amplitude value based on a sum of values for each of the sub-Nyquist zones, the values being obtained by multiplication of the sampling sequences by the corresponding coefficients; and performing separation processing for separation of at least one of a cause of an error or an error portion in the target signal by using the selected frequency group.

15. A signal analysis method comprising:

outputting a plurality of sampling sequences obtained by adding, to respective signals obtained by branching a target signal into a plurality of branches, different delay times and by sampling each of the signals at a sampling rate lower than a Nyquist rate;

converting each of the plurality of sampling sequences from a time domain signal to a frequency domain signal;

collectively performing phase compensation processing and processing for multiplying the sampling sequences by coefficients that cancel phase rotation caused by delay time differences between the sampling sequences, the phase compensation processing corresponding to sub-Nyquist zones of each of the sampling sequences converted into a frequency domain signal;

estimating a frequency of the target signal by determining a sub-Nyquist zone in which the target signal has been folded;

selecting a frequency group with a higher estimated spectrum amplitude value based on a sum of values for each of the sub-Nyquist zones, the values being obtained by multiplication of the sampling sequences by the corresponding coefficients; and performing separation processing for separation of at least one of a cause of an error or an error portion in the target signal by using the selected frequency group.

\* \* \* \* \*